(12) United States Patent
Fukazawa et al.

(10) Patent No.: US 12,212,344 B2
(45) Date of Patent: Jan. 28, 2025

(54) INFORMATION PROCESSING APPARATUS AND PRESET DICTIONARY GENERATING METHOD

(71) Applicant: Kioxia Corporation, Tokyo (JP)

(72) Inventors: Youhei Fukazawa, Kawasaki Kanagawa (JP); Keiri Nakanishi, Kawasaki Kanagawa (JP); Sho Kodama, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 193 days.

(21) Appl. No.: 17/941,376

(22) Filed: Sep. 9, 2022

(65) Prior Publication Data

US 2023/0283294 A1    Sep. 7, 2023

(30) Foreign Application Priority Data

Mar. 4, 2022    (JP) .................. 2022-033629

(51) Int. Cl.
*H03M 1/02*    (2006.01)
*H03M 7/30*    (2006.01)
*H03M 7/46*    (2006.01)

(52) U.S. Cl.
CPC ........... *H03M 7/3088* (2013.01); *H03M 7/46* (2013.01)

(58) Field of Classification Search
CPC ........ H03M 7/3084; H03M 7/30; H03M 7/40; H03M 7/42; H03M 7/24; H03M 7/3064; H03M 7/3086; H03M 7/3091; H03M 7/46; H03M 7/6058; H03M 7/6064; H03M 7/6076; G06F 12/0886; G06F 16/2228; G06F 16/2379; G06F 16/245; G06F 16/24568; G06F 16/275; G06F 2212/401; G06F 40/53
USPC .............................. 341/51, 65–67, 106, 107
See application file for complete search history.

(56) References Cited

U.S. PATENT DOCUMENTS

| | | | | |
|---|---|---|---|---|
| 5,635,932 A | * | 6/1997 | Shinagawa | G06T 9/005 341/51 |
| 5,646,617 A | * | 7/1997 | Ohmoto | H03M 7/3088 341/51 |
| 6,192,259 B1 | * | 2/2001 | Hayashi | H04W 88/02 455/72 |
| 6,407,298 B1 | * | 6/2002 | Matsumoto | C07C 45/512 570/191 |
| 6,529,912 B2 | * | 3/2003 | Satoh | H03M 7/3084 707/693 |
| 6,542,640 B1 | * | 4/2003 | Morihara | G06F 40/53 715/236 |

(Continued)

FOREIGN PATENT DOCUMENTS

JP    4456554 B2    4/2010
JP    2014-023101 A    2/2014

*Primary Examiner* — Linh V Nguyen
(74) *Attorney, Agent, or Firm* — Maier & Maier, PLLC

(57) ABSTRACT

According to one embodiment, an information processing apparatus includes a processor. The processor divides teacher data into character strings, calculates a score of each of the character strings based on at least an appearance frequency of each character string in the character strings, an appearance position of each of the character string in the character strings, and a length of each of the character strings, and determines a position of each of the character strings in a preset dictionary based on the score.

20 Claims, 16 Drawing Sheets

| Character string | Appearance frequency | Appearance position | Length | Score |
|---|---|---|---|---|
| Message-ID: | 80 | 1 | 11 | 960 |
| <0123456. | 2 | 12 | 9 | 260 |
| 54321 | 3 | 21 | 5 | 759 |
| ... | ... | ... | ... | ... |
| From: | 60 | 81 | 5 | 12150 |
| X-Origin: | 1 | 138 | 9 | 18630 |
| ... | ... | ... | ... | ... |
| X-FileName: | 20 | 159 | 10 | 31800 |

(56) References Cited

U.S. PATENT DOCUMENTS

| | | | | |
|---|---|---|---|---|
| 7,310,055 B2* | 12/2007 | Odagiri | ............... | H03M 7/3084 |
| | | | | 707/999.1 |
| 10,187,081 B1* | 1/2019 | Diamant | ............. | H03M 7/3088 |
| 2015/0381201 A1* | 12/2015 | Ansari | ................ | H03M 7/3084 |
| | | | | 341/87 |
| 2016/0224520 A1* | 8/2016 | Kataoka | .............. | H03M 7/3084 |
| 2017/0279933 A1* | 9/2017 | Schurman | ............. | G06F 16/275 |

* cited by examiner

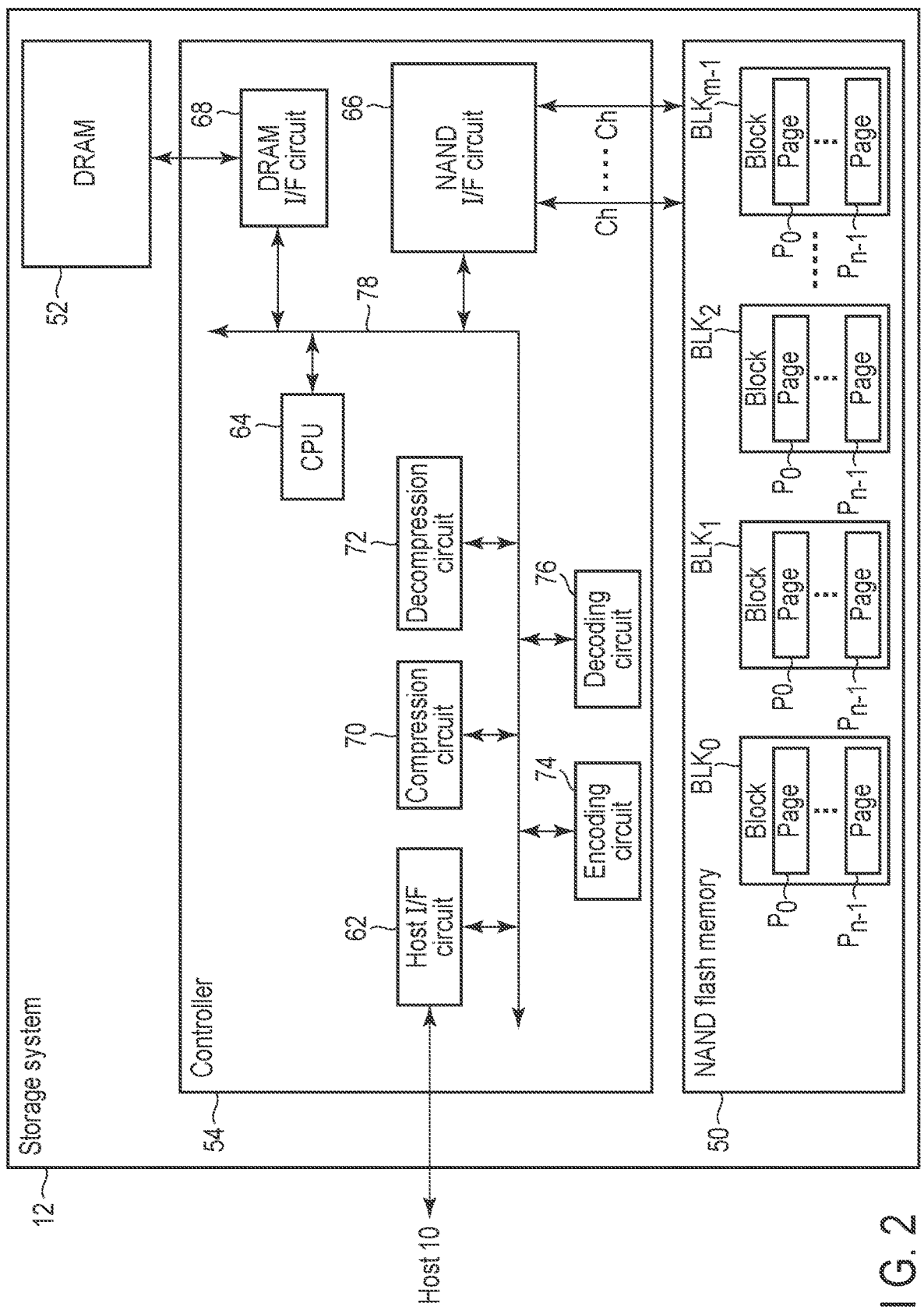
F I G. 2

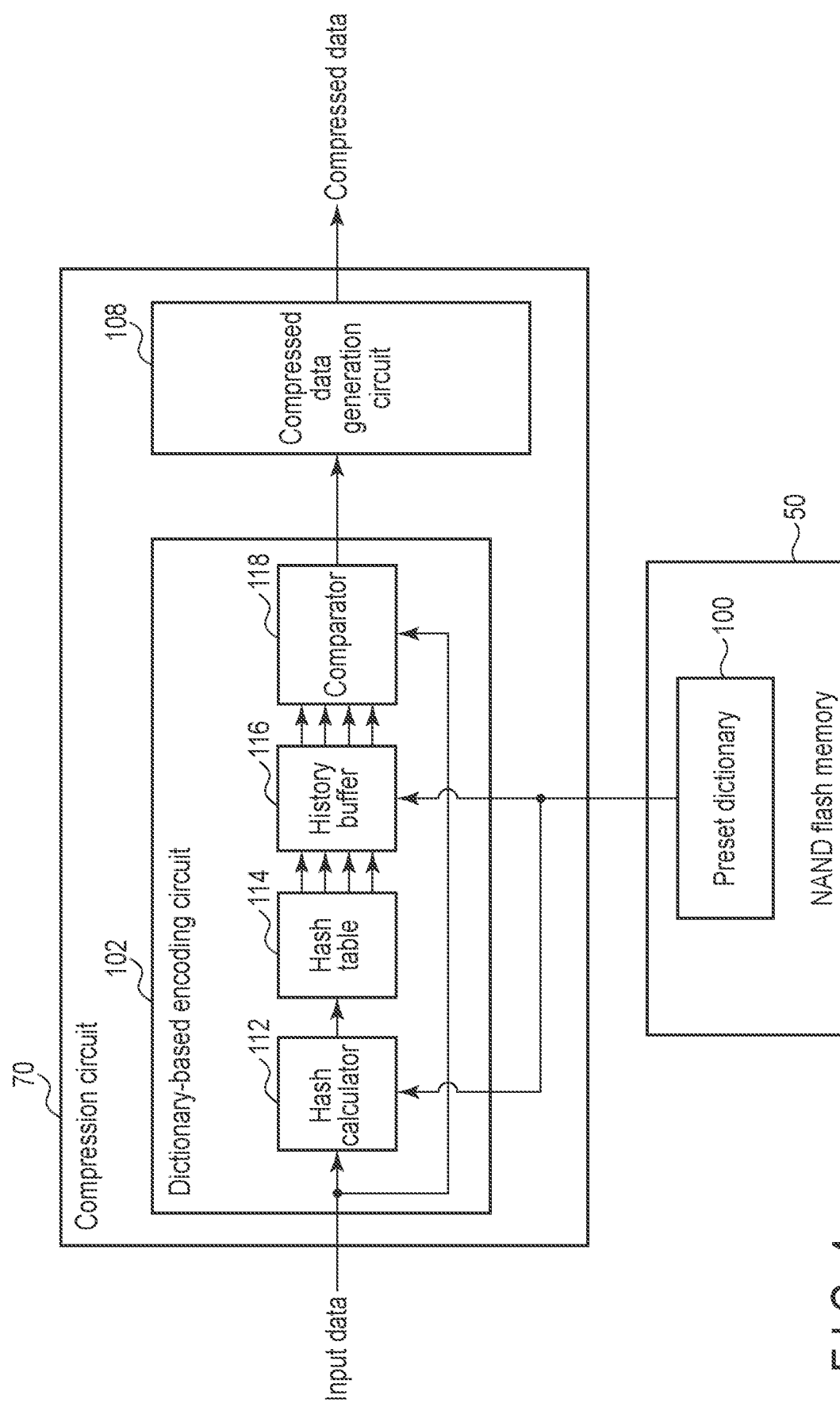
F I G. 4

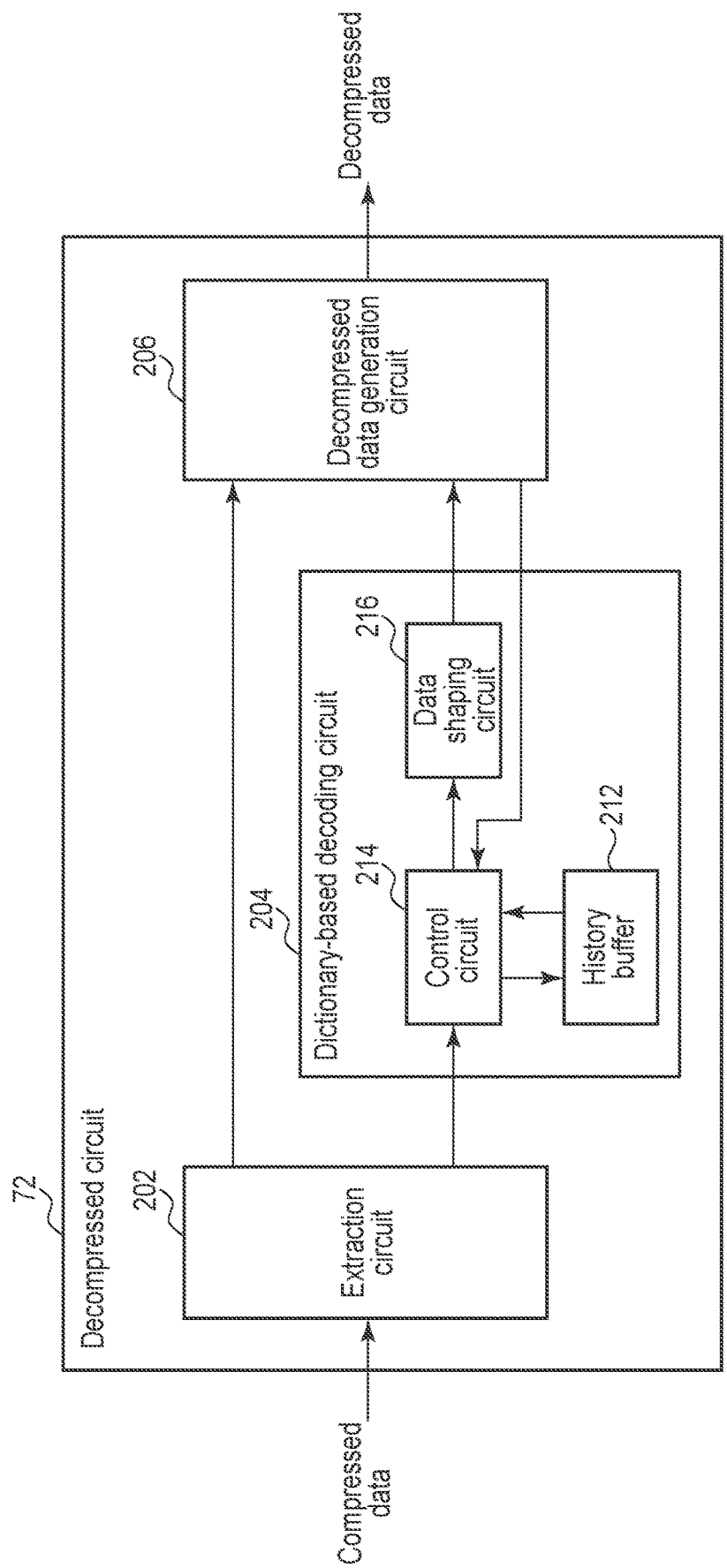
F I G. 5

```
Message-ID: <0123456.54321
Date: Mon, 14 May 2001 16:39:00 -0700 (PDT)
From: aa.aa@aa.com
To: bb.bb@bb.com
X-Origin: aa
X-FileName: aa1 (Non-Privileged).pst
Here is our forecast
```

FIG. 7

| Character string | Appearance frequency | Appearance position | Score |
|---|---|---|---|
| Message-ID: | 80 | 1 | 80 |
| <0123456. | 2 | 12 | 26 |
| 54321 | 3 | 21 | 69 |
| ... | ... | ... | ... |
| From: | 30 | 81 | 2430 |
| ... | ... | ... | ... |
| X-Origin: | 15 | 138 | 2070 |
| ... | ... | ... | ... |
| X-FileName: | 20 | 159 | 3180 |

FIG. 8

| Character string | Appearance frequency | Appearance position | Length | Score |
|---|---|---|---|---|
| Message-ID: | 80 | 1 | 11 | 960 |
| <0123456. | 2 | 12 | 9 | 260 |
| 54321 | 3 | 21 | 5 | 759 |
| ... | ... | ... | ... | ... |
| From: | 60 | 81 | 5 | 12150 |
| X-Origin: | 1 | 138 | 9 | 18630 |
| ... | ... | ... | ... | ... |
| X-FileName: | 20 | 159 | 10 | 31800 |

| Character string | Appearance frequency | Length | First score |
|---|---|---|---|
| Message-ID: | 80 | 11 | 46 |
| <0123456. | 2 | 9 | 6 |
| 54321 | 3 | 5 | 7 |
| ... | ... | ... | ... |
| From: | 60 | 5 | 27 |
| X-Origin: | 60 | 9 | 34 |
| ... | ... | ... | ... |
| X-FileName: | 20 | 10 | 15 |

| Character string | First score | Appearance frequency | Second score |
|---|---|---|---|
| Message-ID: | 46 | 1 | 1 |
| From: | 27 | 81 | 40 |
| X-Origin: | 34 | 138 | 69 |

FIG. 15B

| Character string | First score | Appearance frequency | Second score |
|---|---|---|---|
| X-Origin: | 34 | 138 | 69 |
| From: | 27 | 81 | 40 |
| Message-ID: | 46 | 1 | 1 |

FIG. 16A

| Character string | First score | Appearance frequency | Second score |
|---|---|---|---|
| <0123456. | 6 | 12 | 6 |
| 54321 | 7 | 21 | 11 |
| X-FileName: | 15 | 159 | 79 |

FIG. 16B

| Character string | First score | Appearance frequency | Second score |
|---|---|---|---|
| X-FileName: | 15 | 159 | 79 |
| 54321 | 7 | 21 | 11 |
| <0123456. | 6 | 12 | 6 |

| Character string | Appearance frequency | Appearance position | Score | Preset dictionary writable flag | Most appearance subsequent character string | Preset dictionary writable flag of most appearance subsequent character string | The concatenation flag | Concatenated character string in preset dictionary |
|---|---|---|---|---|---|---|---|---|
| Message-ID: | 80 | 1 | 80 | Written | <0123456. | Written | TRUE | Message-ID: <0123456. |
| <0123456. | 5 | 12 | 65 | Written | 54321 | Not written | FALSE | None |
| 54321 | 1 | 21 | 23 | Not written | None | — | FALSE | None |
| From: | 30 | 81 | 2430 | Written | None | — | FALSE | From: |
| X-Origin: | 15 | 138 | 2070 | Written | None | — | FALSE | X-Origin: |
| X-FileName: | 20 | 159 | 3180 | Written | None | — | FALSE | X-FileName: |

F I G. 19

INFORMATION PROCESSING APPARATUS AND PRESET DICTIONARY GENERATING METHOD

CROSS-REFERENCE TO RELATED APPLICATIONS

This application is based upon and claims the benefit of priority from Japanese Patent Application No. 2022-033629, filed Mar. 4, 2022, the entire contents of which are incorporated herein by reference.

BACKGROUND

Embodiments described herein relate generally to an information processing apparatus and a preset dictionary generating method.

As a technique for compressing data, dictionary-based compression technique based on reference to a history buffer is known. This compression technique is known as LZ77. The dictionary-based compression technique requires a history buffer to store prior data. An example of the history buffer is a first-in first-out (FIFO) buffer memory. The prior data matching at least a part of the input data is searched from the history buffer. In a case where prior data matching at least a part of the input data is stored in the history buffer, the input data is converted into reference information to the history buffer. The reference information includes information indicating that prior data matching at least a part of the input data is stored in the history buffer, length information of the matched data, and matching position information specifying the matched prior data. The length information is also referred to as matching length information. The matching position information indicates how long ago the prior data was input in the past as viewed from the current input data. In a case where prior data matching at least a part of the input data is not stored in the history buffer, the input data is converted into non-reference information. The non-reference information includes information indicating that prior data matching at least a part of the input data is not stored in the history buffer, and data of the input data as is.

The size of the reference information is smaller than the size of the input data. The input data can be compressed by converting the input data into the reference information. The compressed input data may be encoded. An example of encoding is entropy encoding. An example of entropy encoding is Huffman encoding.

After compression, the input data is written to the history buffer. Before the input data is written to the history buffer, the oldest input data having the same size as the input data to be written is discarded from the history buffer.

Before the start of compression, the history buffer is empty, so that the history buffer cannot be referred to. Therefore, there is a technology of writing dictionary data in the history buffer before the start of compression, referring to the history buffer even immediately after the start of compression, and making it possible to convert the input data to the reference information. The dictionary data to be stored in the history buffer before the start of compression is referred to as a preset dictionary.

The preset dictionary is generated using teacher data. The teacher data includes a plurality of partial data. When the compression target is text data, the partial data is a word. When the preset dictionary is generated, the appearance frequency of each word in the teacher data is calculated. When the teacher data is written to the history buffer as the preset dictionary, the writing position of the history buffer of each word is determined according to the application frequency of each word. The words are stored from the input side to the output side of the history buffer in descending order of appearance frequency. The word having the highest appearance frequency is written to an area closest to the input side. The word having the lowest appearance frequency is written to an area closest to the output side. Therefore, a word having the high appearance frequency is stored in the history buffer for a long time, and a word having the low appearance frequency is discarded from the history buffer in a short time. In a case where a word having the low appearance frequency is located at a rear position of the input data, there is a possibility that the word has already been discarded from the history buffer at the time of compressing the word, the compression cannot be executed, and compression ratio may decrease.

BRIEF DESCRIPTION OF THE DRAWINGS

FIG. 2 is a block diagram illustrating an example of a storage system according to the first embodiment.

FIG. 4 is a diagram illustrating an example of a compression circuit according to the first embodiment.

FIG. 5 illustrates an example of a decompression circuit according to the first embodiment.

FIG. 7 illustrates an example of teacher data according to the first embodiment.

FIG. 8 is a table illustrating an example of a score according to the first embodiment.

FIG. 14 is a table illustrating an example of a first score according to the third embodiment.

FIG. 15A is a table illustrating an example of a second score regarding a character string of a first group according to the third embodiment.

FIG. 15B is a table illustrating an example of a result of sorting the character strings of the first group in descending order of the second score, according to the third embodiment.

FIG. 16A is a table illustrating an example of a second score according to the third embodiment.

FIG. 16B is a table illustrating an example of a result of sorting the character strings of the second group in descending order of the second score, according to the third embodiment.

FIG. 19 illustrates an example of a score according to the fourth embodiment.

DETAILED DESCRIPTION

Figure 1:
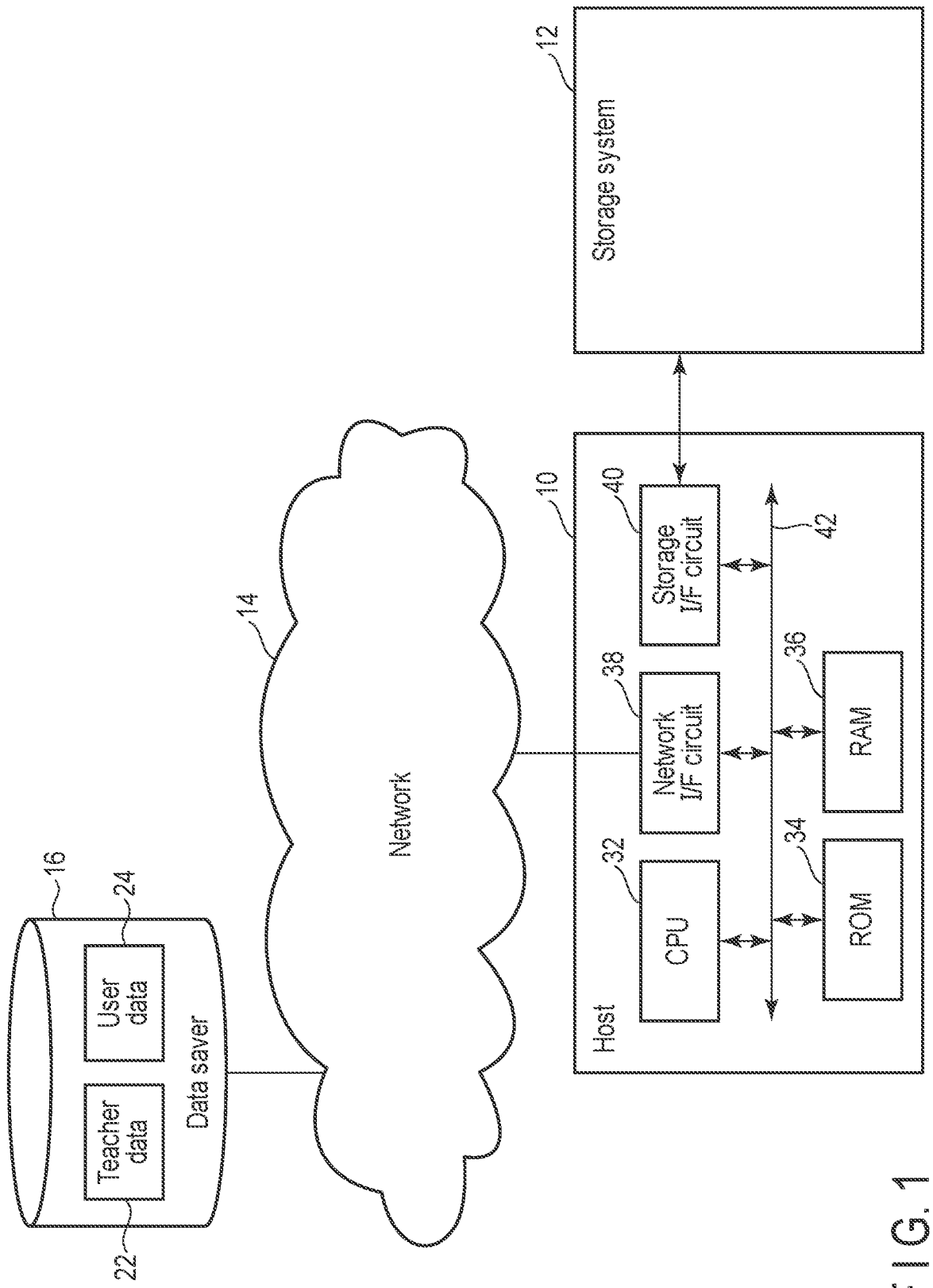
FIG. 1 is a block diagram illustrating an example of a system including an information processing apparatus according to a first embodiment.

Various embodiments will be described hereinafter with reference to the accompanying drawings.

The disclosure is merely an example and is not limited by contents described in the embodiments described below. Modification which is easily conceivable by a person of ordinary skill in the art comes within the scope of the disclosure as a matter of course. In order to make the description clearer, the sizes, shapes, and the like of the respective parts may be changed and illustrated schematically in the drawings as compared with those in an accurate representation. Constituent elements corresponding to each other in a plurality of drawings are denoted by like reference numerals and their detailed descriptions may be omitted unless necessary.

In general, according to one embodiment, an information processing apparatus comprising a processor configured to generate a preset dictionary based on teacher data. The processor is configured to divide the teacher data into character strings; calculate a score of each of the character strings based on at least an appearance frequency of each character string in the character strings, an appearance position of each of the character string in the character strings, and a length of each of the character strings; and determine a position of each of the character strings in the preset dictionary based on the score.

First Embodiment

FIG. 1 is a block diagram illustrating an example of a system including an information processing apparatus according to a first embodiment. An example of the information processing apparatus is a host 10. The host 10 is connected to a storage system 12 and a network 14.

The host 10 is an information processing apparatus that accesses the storage system 12. The host 10 transmits a command for instructing an operation of the storage system 12 to the storage system 12 and controls the storage system 12. The host 10 may be a server (storage server) that stores a large amount of various data in the storage system 12. The host 10 may be a personal computer. The storage system 12 may be a system for business use incorporated in a server of a data center or the like. The storage system 12 may be a system for personal use incorporated in a personal computer.

The host 10 includes a CPU 32, a ROM 34, a RAM 36, a network interface (referred to as a network I/F circuit) 38, and a storage interface (referred to as a storage I/F circuit) 40. The ROM 34 is a nonvolatile memory that stores a program executed by the CPU 32. The RAM 36 is a volatile memory that stores data. The network I/F circuit 38 is connected to the network 14 and controls transmission and reception with respect to the network 14. The storage I/F circuit 40 controls transmission and reception with respect to the storage system 12. The CPU 32, the ROM 34, the RAM 36, the network I/F circuit 38, and the storage I/F circuit 40 are connected to a bus 42.

A data server 16 is connected to the network 14. The data server 16 stores teacher data 22 and user data 24. The user data 24 is data for each user of the storage system 12. The user data 24 may include a plurality of types of data. For example, mail data, image data, and the like of the same user may be stored in the data server 16. The user data 24 is uncompressed data. The host 10 reads the user data 24 from the data server 16 and transmits the user data to the storage system 12. The storage system 12 compresses the user data 24 using dictionary-based compression, executes predetermined processing such as an error correction coding on the compressed data, and then stores the compressed data in a NAND flash memory in the storage system 12. The teacher data 22 is data used for generating a preset dictionary required for dictionary-based compression. The host 10 or another server may generate the teacher data 22 before the start of compression and transmit the teacher data 22 to the data server 16. The teacher data 22 is generated for each user. The teacher data 22 may be generated for each user and for each type of user data. The teacher data 22 may be generated from the user data 24. Before the storage system 12 compresses and stores the compressed user data 24, the host 10 reads the teacher data 22 from the data server 16, generates a preset dictionary using the teacher data 22, and transmits the preset dictionary to the storage system 12.

The storage system 12 can be used as a main storage of the host 10. The storage system 12 may be incorporated in the host 10 or may be provided outside the host 10 and connected to the host 10 via a cable or a network.

FIG. 2 is a block diagram illustrating an example of the storage system 12 according to the first embodiment. The storage system 12 includes a NAND flash memory 50, a dynamic random access memory (DRAM) 52, and a controller 54. The storage system 12 is also referred to as a solid state drive (SSD).

The NAND flash memory 50 is an example of a nonvolatile memory. Instead of the NAND flash memory 50, a NOR flash memory, a phase change memory (PCM), a magneto-resistive random access memory (MRAM), a phase change random access memory (PRAM), a resistive random access memory (ReRAM), or a ferroelectric random access memory (FeRAM) may be used.

The NAND flash memory 50 includes a memory cell array including a plurality of memory cells arranged in a matrix. The memory cell array may have a two-dimensional structure or a three-dimensional structure.

The memory cell array of the NAND flash memory 50 includes a plurality of blocks $BLK_0$ to $BLK_{m-1}$. "m" is a positive integer of 2 or more. Each of the blocks $BLK_0$ to $BLK_{m-1}$ includes a large number of pages (here, pages $P_0$ to $P_{n-1}$). "n" is a positive integer of 2 or more. The blocks $BLK_0$ to $BLK_{m-1}$ function as erase units. Each of pages $P_0$ to $P_{n-1}$ includes a plurality of memory cells connected to the same word line. The pages $P_0$ to $P_{n-1}$ are a unit of a data write operation and a unit of a data read operation.

The DRAM 52 is an example of a volatile memory. The DRAM 52 is, for example, a DRAM of a double data rate 3 low voltage (DDR3L) standard. The DRAM 52 includes a write buffer, a read buffer, a management information buffer, and the like. Data being transmitted from the host 10 to the storage system 12 and being written to the NAND flash memory 50 or unwritten is stored in the write buffer. Data that is read from the NAND flash memory 50 and is being transmitted to the host 10 or not transmitted is stored in the read buffer. A lookup table, various tables used during the operation of the storage system 12, and various values are stored in the management information buffer. The DRAM 52 also functions as a temporary buffer of software executed in the controller 54. The DRAM 52 may be provided not only outside the controller 54 but also inside the controller 54. As the volatile memory, instead of the DRAM 52, a static random access memory (SRAM) that can be accessed at a higher speed may be used.

The controller 54 is configured to write data in the NAND flash memory 50 or read data from the NAND flash memory 50 according to a command transmitted from the host 10. The controller 54 can be configured by a circuit such as a system on a chip (SoC). The controller 54 has a function of controlling the operation of the storage system 12. The controller 54 includes a host interface (referred to as a host I/F circuit) 62, a CPU 64, a NAND interface (referred to as a NAND I/F circuit) 66, a DRAM interface (referred to as a DRAM I/F circuit) 68, a compression circuit 70, a decompression circuit 72, an encoding circuit 74, and a decoding circuit 76. The host I/F circuit 62, the CPU 64, the NAND I/F circuit 66, the DRAM I/F circuit 68, the compression circuit 70, the decompression circuit 72, the encoding circuit 74, and the decoding circuit 76 are connected to a bus 78. The encoding circuit 74 may be provided inside the compression circuit 70 instead of being provided separately from the compression circuit 70. The decoding circuit 76 may be provided inside the decompression circuit 72 instead of being provided separately from the decompression circuit 72.

The storage system 12 compresses the uncompressed data transmitted from the host 10 by the compression circuit 70, encodes the compressed data by the encoding circuit 74, and writes the encoded data in the NAND flash memory 50. The storage system 12 decodes the encoded data read from the NAND flash memory 50 by the decoding circuit 76 to obtain compressed data, decompresses the compressed data by the decompression circuit 72, generates uncompressed data, and transmits the uncompressed data to the host 10.

The host I/F circuit 62 is configured to execute communication with the host 10. Communication with the host 10 conforms to, for example, the PCI Express™ standard. The host I/F circuit 62 receives a command from the host 10.

The CPU 64 is a processor configured to control the host I/F circuit 62, the NAND I/F circuit 66, the DRAM I/F circuit 68, the compression circuit 70, the decompression circuit 72, the encoding circuit 74, and the decoding circuit 76. In response to power-on of the storage system 12, the CPU 64 loads a control program (firmware) from the NAND flash memory 50 or a read only memory (ROM) in the CPU 64 into the DRAM 52, and executes the control program to perform various processes. The CPU 64 can execute processing for various commands from the host 10. The operation of the CPU 64 is controlled by a control program executed by the CPU 64. Part or all of the processing for the command from the host 10 may be executed by dedicated hardware of the controller 54.

The NAND I/F circuit 66 is a memory control circuit configured to control the NAND flash memory 50 under the control of the CPU 64. The NAND I/F circuit 66 and the NAND flash memory 50 are connected by a plurality of channels Chs. The NAND flash memory 50 includes a large number of memory chips. A plurality of memory chips are connected to each channel.

The DRAM I/F circuit 68 is a DRAM control circuit configured to control the DRAM 52 under the control of the CPU 64.

The compression circuit 70 compresses input data (uncompressed data) by dictionary-based compression and outputs compressed data. The encoding circuit 74 encodes the compressed data output from the compression circuit 70. Examples of the encoding include entropy encoding such as Huffman coding and run-length encoding. The encoded compressed data is written to the NAND flash memory 50. Furthermore, after the compressed data encoded by the encoding circuit 74 is output from the encoding circuit 74, predetermined processing such as an error correction coding or randomization processing may be executed. In this case, the CPU 64 writes data obtained by executing predetermined processing on the encoded compressed data in the NAND flash memory 50 via the NAND I/F circuit 66. That is, the CPU 64 writes data based on the encoded compressed data output from the encoding circuit 74 in the NAND flash memory 50.

The decoding circuit 76 decodes the encoded compressed data read from the NAND flash memory 50. The decompression circuit 72 decompresses the compressed data decoded by the decoding circuit 76 and outputs uncompressed data. For example, when reading encoded compressed data from the NAND flash memory 50 based on a read command received from the host 10 via the NAND I/F circuit 66, the CPU 64 reads data based on the read command from the NAND flash memory 50 via the NAND I/F circuit 66. The data read from the NAND flash memory 50 may be transmitted as encoded compressed data to the decoding circuit 76 by the CPU 64 after predetermined processing such as an error correction coding and a de-randomizing is executed on the data. The decoding circuit 76 may decode the encoded compressed data to obtain compressed data. The decompression circuit 72 may decompress the compressed data. That is, the decoding circuit 76 may decode encoded compressed data read from the NAND flash memory 50.

The compression circuit 70, the decompression circuit 72, the encoding circuit 74, and the decoding circuit 76 may be realized by a dedicated circuit (SoC). The compression circuit 70, the decompression circuit 72, the encoding circuit 74, and the decoding circuit 76 may be realized by the CPU 64 executing a compression or decompression program (firmware). Although the compression circuit 70 and the decompression circuit 72 have been described as being incorporated in the controller 54 included in the storage system 12, one or both of the compression circuit 70 and the decompression circuit 72 may be provided outside the storage system 12 (for example, the host 10).

Figure 3:
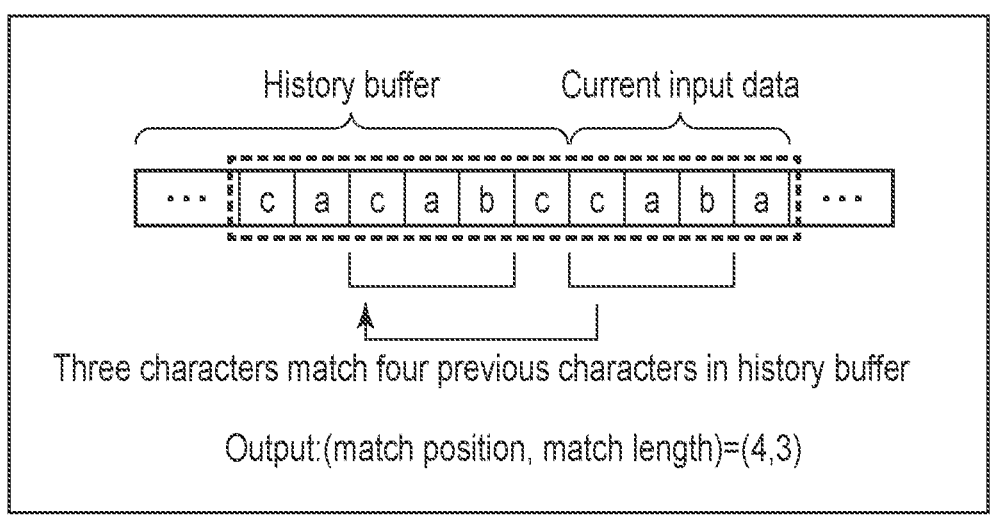
FIG. 3 is a diagram for explaining an outline of dictionary-based compression technique according to the first embodiment.

The compression circuit 70 and the decompression circuit 72 will be described. FIG. 3 is a diagram for describing an outline of the dictionary-based compression technique according to the first embodiment. Any type of input data may be input to the compression circuit 70 as uncompressed data to be compressed. In the present specification, the input data is assumed to be text (character string) data. In the dictionary-based compression, input data is converted into a reference information. The reference information indicates reference to previously input data (that is, data input before the input data). The previously input data may be referred to as a prior data.

In the dictionary-based compression, the prior data is stored in the history buffer, and it is searched whether or not data (forward data) that matches all or a part of the input data is stored in the history buffer. In a case where data matching all or a part of the input data is stored in the history buffer, information indicating that data matching all or a part of the input data is stored in the history buffer, matching length information, and matching position information are output. The matching length information indicates a matched length between the input data and the data searched from the history buffer. The matching position information indicates a position of the forward data matching the input data in the history buffer. The matching position information may be referred as matching length information indicating a relative distance from the current input data to the forward data. It is known that by writing the preset dictionary to the history buffer, an empty state of the history buffer is eliminated, that is, compression ratio is improved.

FIG. 3 illustrates an example wherein the current input data is "caba" and a text " . . . cacabc" is stored in the history buffer. According to this example, a part of the input data "caba" matches the two characters of "ca" and the three characters of "cab" in the history buffer. If a longer portion of the input data can be replaced with the reference information, compression ratio is improved. Therefore, here, "cab" in the history buffer is selected as data (hereinafter, referred to as buffer data) at least partially matching the input data.

Since the start position of the buffer data "cab" selected in this manner is four characters before the start position of the input data, the matching position (matching relative distance from the input data to the matching point) is four. In addition, since the input data and the buffer data have "cab" matching, the matching length is three (characters).

That is, in the example illustrated in FIG. 3, the reference information including the pair (4, 3) of the matching position information and the matching length information as a result of the dictionary-based compression on the input data "caba" and a matching flag information indicating that at least a part of the input data matches at least a part of the data stored in the history buffer is output to the subsequent stage.

When the compression of the input data "caba" ends, the input data "caba" is fetched into the history buffer as prior data. The history buffer is a FIFO buffer memory, and when the input data "caba" is fetched into the history buffer, prior data having the same size as the input data "caba" is discarded from the history buffer. The history buffer always stores prior data of a constant size. The history buffer is not limited to the FIFO buffer memory, and may be configured by a ring buffer.

In the dictionary-based compression, processing is executed so as to sequentially encode continuously input data. In this case, a character "a" at the end position of the input data "caba" that does not match the buffer data is handled as the next input data together with the subsequent input data, and "cab" of the input data "caba" is extracted.

FIG. 4 is a diagram illustrating an example of the compression circuit 70 according to the first embodiment. The compression circuit 70 includes a dictionary-based encoding circuit 102 and a compressed data generation circuit 108.

The dictionary-based encoding circuit 102 compresses input data based on dictionary-based compression. In the dictionary-based compression, it is determined whether or not data matching all or a part of the input data is stored in the history buffer. When the data matching all or a part of the input data is stored in the history buffer, matching position information and matching length information of the data matching all or a part of the input data are determined. The input data is compressed by converting the input data into the matching position information and the matching length information.

The dictionary-based encoding circuit 102 includes a hash calculator 112, a hash table 114, a history buffer 116, and a comparator 118. The hash calculator 112 calculates, from at least a part of input data, a hash value of the input data using a hash function prepared in advance. The hash table 114 stores a hash value calculated from at least a part of data input to the compression circuit 70 in the past in association with an address indicating a storage position of the data in the history buffer 116. The address is simply referred to as an address of data. The history buffer 116 stores data (buffer data) input to the compression circuit 70 in the past.

Before start of the first operation of the compression circuit 70, the hash table 114 and the history buffer 116 are empty. Before start of the first operation, the host 10 generates a plurality of preset dictionaries 100 and transmits one of the preset dictionaries 100 to the storage system 12. The preset dictionaries may be generated for each type of input data. The controller 54 writes the preset dictionary 100 transmitted from the host 100 to the history buffer 116, and writes the address of the history buffer 116 in the hash table 114. As a result, the compression circuit 70 can compress the input data. The controller 54 also stores preset dictionary type information indicating the type of the preset dictionary 100 written to the history buffer 116. The controller 54 may write the preset dictionary 100 in the NAND flash memory 50. In this case, the controller 54 can reset the contents of the history buffer 116 to the preset dictionary at an arbitrary timing. For example, in a case where the content of the user data to be compressed greatly changes, resetting the history buffer 116 may improve compression ratio. The content of the user data greatly changes, for example, when the data server 16 that transmits the user data changes.

Since the hash table 114 and the history buffer 116 are provided, it is possible to acquire an address stored in the hash table 114 in association with the hash value of the input data calculated by the hash calculator 112 and search the history buffer 116 for the buffer data stored at the address.

The buffer data searched from the history buffer 116 is data having a possibility of at least partially matching the input data since the hash value is common. In a case where a plurality of addresses are stored in association with the same hash value in the hash table 114, a plurality of buffer data may be searched as buffer data at least partially matching the input data.

The comparator 118 compares the input data with the buffer data searched from the history buffer 116. In a case where the buffer data matching at least a part of the input data is stored in the history buffer 116, the comparator 118 acquires matching length information indicating a matched length between the input data and the buffer data and matching position information indicating how long ago the buffer data was input in the past as viewed from the current input data. The comparator 118 outputs the reference information. The reference information includes the matching flag information indicating that buffer data matching at least a part of the input data is stored in the history buffer 116, the matching length information, and the matching position information. The matching flag information may be 1-bit information.

The comparator 118 outputs non-reference information in a case where the hash value calculated by the hash calculator 112 is not stored in the hash table 114, that is, in a case where buffer data matching at least a part of the input data is not stored in the history buffer 116. The non-reference information includes non-matching flag information indicating that buffer data matching at least a part of the input data is not stored in the history buffer 116, and data of the input data as is. The non-matching flag information may be 1-bit information.

When a plurality of buffer data are being searched, a matching length with the input data is determined for each of the buffer data. In this case, a buffer data having the longest matching length may be selected from a plurality of buffer data, and the matching length information and the matching position information of the selected buffer data are only required to be output.

Although not illustrated in FIG. 4, the input data is newly written (or added) to the history buffer 116. Before the input data is written to the history buffer 116, the oldest data in the history buffer 116 is discarded from the history buffer 116. In a case where the input data is written to the history buffer 116, the hash value calculated by the hash calculator 112 and the address of the input data written to the history buffer 116 are written (written) to the hash table 114.

The compressed data generation circuit 108 packs the reference information and the non-reference information output from the comparator 118 to generate compressed data. The compressed data generation circuit 108 generates compressed data as a bit stream using the bit of the matching flag information, the bit of the matching length information, the bit of the matching position information included in the reference information; and the bit of the non-matching flag information and the bit of the input data included in the non-reference information. Further, the compressed data generation circuit 108 adds the bit of the type information of the preset dictionary used when the reference information is output to the start position of the compressed data, and outputs the compressed data including the bit of the type information of the preset dictionary. The compressed data generated by the compressed data generation circuit 108 is output to the outside of the compression circuit 70.

A part or all of the dictionary-based encoding circuit 102 and the compressed data generation circuit 108 may be realized by dedicated hardware. A part or all of the dictionary-based encoding circuit 102 and the compressed data generation circuit 108 may be realized by software by the CPU 64 of the controller 54 executing a predetermined program.

The decompression circuit 72 will be described.

FIG. 5 illustrates an example of the decompression circuit 72 according to the first embodiment. The decompression circuit 72 includes an extraction circuit 202, a dictionary-based decoding circuit 204, and a decompressed data generation circuit 206. When the encoded data is decompressed, the encoded data is input to the decoding circuit 76. The decoding circuit 76 decodes the encoded data and inputs a decoding result (compressed data) to the decompression circuit 72. When receiving the compressed data that is the compressed stream input from the decoding circuit 76, the extraction circuit 202 detects the matching flag information or the non-matching flag information and extracts the reference information or the non-reference information. The extraction circuit 202 transmits the matching length information and the matching position information included in the reference information to the dictionary-based decoding circuit 204. The extraction circuit 202 transmits the input data included in the non-reference information to the decompressed data generation circuit 206.

The dictionary-based decoding circuit 204 includes a history buffer 212, a control circuit 214, and a data shaping circuit 216.

The dictionary-based decoding circuit 204 reads from the history buffer 212 using the matching position information as the address information of the history buffer 212 and using the matching length information as the read length, and generates data (input data) before being compressed in the compression circuit 70.

The history buffer 212 stores input data (input data before compression input to the compression circuit 70) generated based on the matching length information and the matching position information included in the reference information output from the extraction circuit 202, and the input data output from the extraction circuit 202. The preset dictionary of the history buffer 212 is the same dictionary as the preset dictionary used at the time of compression determined from the bit of the type information of the preset dictionary written to the start position of the compressed data output from the compressed data generation circuit 108.

The control circuit 214 reads the buffer data from the history buffer 212 based on the matching length information and the matching position information. The control circuit 214 reads buffer data stored at the address indicated by the matching position information, the buffer data having at least the number of characters equal to or larger than the matched length. The control circuit 214 transmits the read buffer data and the matching length information to the data shaping circuit 216.

The data shaping circuit 216 shapes the buffer data based on the matching length information. The data shaping circuit 216 cuts out (extracts) a portion having a length matching the matched length indicated by the matching length information from the buffer data. The buffer data shaped by the data shaping circuit 216 (hereinafter, referred to as shaped data) is output to the decompressed data generation circuit 206.

The decompressed data generation circuit 206 generates the decompressed data including the shaped data output from the data shaping circuit 216 and the input data output from the extraction circuit 202. The decompressed data generated by the decompressed data generation circuit 206 corresponds to the input data sequentially input to the dictionary-based encoding circuit 102. The decompressed data generated by the decompressed data generation circuit 206 is output to the outside of the decompression circuit 72. The decompressed data generation circuit 206 writes the shaped data output from the data shaping circuit 216 and the input data output from the extraction circuit 202 in the history buffer 212 via the control circuit 214.

Some or all of the extraction circuit 202, the dictionary-based decoding circuit 204, and the decompressed data generation circuit 206 may be realized by dedicated hardware. A part or all of the extraction circuit 202, the dictionary-based decoding circuit 204, and the decompressed data generation circuit 206 may be realized by software by the CPU 64 of the controller 54 executing a predetermined program.

Figure 6:
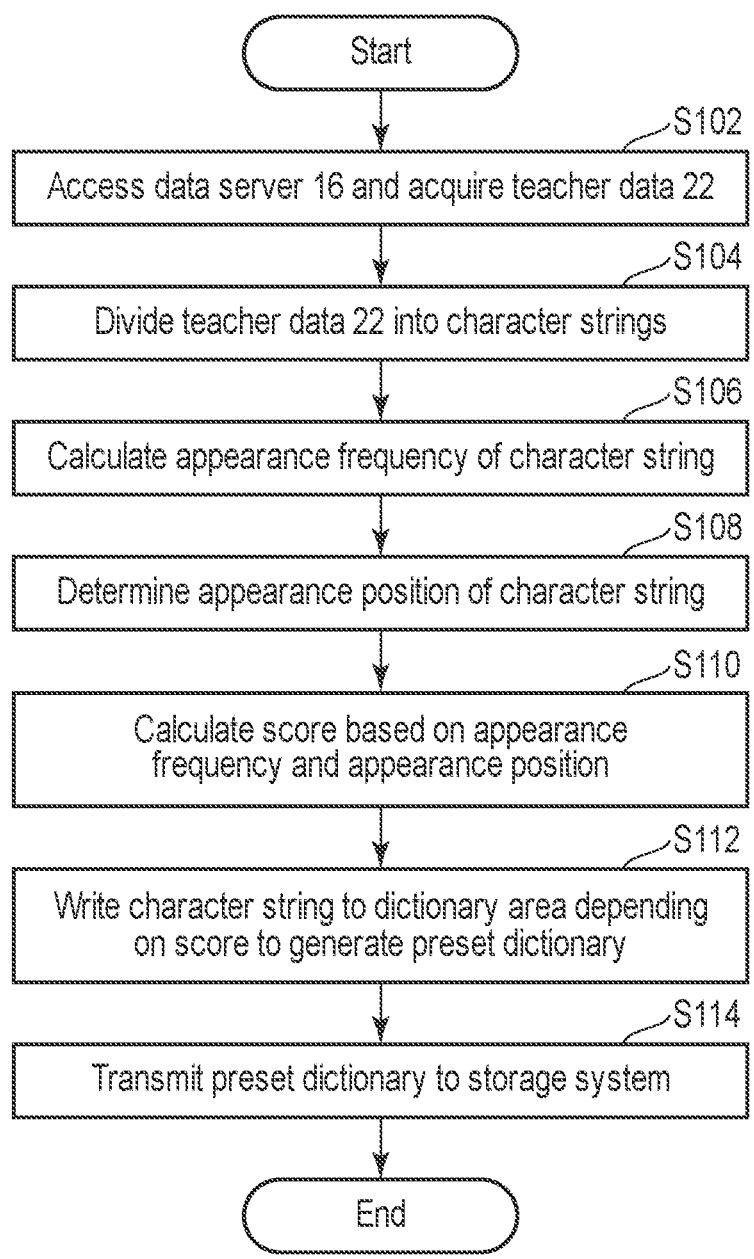
FIG. 6 is a flowchart illustrating an example of processing of a host according to the first embodiment.

FIG. 6 is a flowchart illustrating an example of processing of the host 10 for generating a preset dictionary according to the first embodiment. In a case where the storage system 12 is connected to the host 10 for the first time, the host 10 performs preset dictionary generation processing of FIG. 6 until the compressed data is written to the storage system 12.

The host 10 accesses the data server 16 and acquires the teacher data 22 (S102). It is assumed that the data server 16 stores a plurality of teacher data 22 for each user. FIG. 7 illustrates an example of a plurality of teacher data 22 for each user according to the first embodiment. An example of the teacher data is mail data (text data). The host 10 divides each of the plurality of teacher data 22 into a plurality of character strings (S104). Examples of division of the teacher data include character strings for every N characters, and one character string from a next character of specific character data to a previous character of specific character data. N is an arbitrary integer of 2 or more. Specific character data indicates a space, a period, a comma, a line feed, a colon, or any other data. In S104, at least one character surrounded by two spaces is set as one character string. In the example of the teacher data of FIG. 7, "Message-ID:", "<0123456.", "54321", . . . , "From:", . . . , "X-Origin:", . . . , "X-File-Name:", and the like are character strings.

The host 10 calculates appearance frequency of each character string in the plurality of teacher data 22 (S106). The host 10 determines an appearance position of each character string (S108). The appearance position is a byte position of the first character of the character string when the text data as the teacher data 22 is viewed in byte order from the first byte (the start position of the text). In a case where the same character string has a plurality of appearance positions, the appearance position having the highest appearance frequency is set as the appearance position. The same character string may have a plurality of appearance positions if the same character string appears a plurality of times in different teacher data of a plurality of teacher data, or if the same character string appears a plurality of times in each teacher data of a plurality of teacher data. In a case where the same character string has a plurality of appearance positions, an average position of the appearance positions may be set as the appearance position. For example, since "Message-ID:" appears first in each teacher data 22, the appearance position is 1. Since "<0123456." appears from the twelfth byte of the teacher data 22, the appearance position is 12.

The host 10 may calculate the appearance frequency after determining the appearance position.

The host 10 calculates a score of each character string based on the appearance frequency and the appearance position of each character string (S110). The score is calculated, for example, by the following equation so as to be proportional to the appearance frequency and the appearance position.

$$\text{Score} = \alpha \times AF + x \times AP \qquad \text{Equation 1 or}$$

$$\text{Score} = \alpha \times AF \times \beta \times AP \qquad \text{Equation 2}$$

α and β are different constants which are arbitrarily determined. The constant may be a decimal or an integer.

AF: appearance frequency
AP: appearance frequency

FIG. 8 is a table illustrating an example of the score based on the appearance frequency and the appearance position of each character string, according to the first embodiment. The score is calculated by Equation 2 with α=1 and β=1. The table of FIG. 8 is stored in the RAM 36.

The RAM 36 includes a dictionary area for storing a preset dictionary. The host 10 writes the character string of the teacher data 22 to the dictionary area and generates a preset dictionary.

The size of the dictionary area is the same as the size of the history buffer 116. The dictionary area is defined by a start address and a last address. Data are read from the start address of the dictionary area in ascending order of addresses. The history buffer 116 in which the preset dictionary is stored is a FIFO buffer memory, and data written first is first discarded. Since the character string first read from the dictionary area is first written to the history buffer 116, the character string stored in the start address of the dictionary area is first discarded from the history buffer 116. Therefore, the timing at which the character string is discarded from the history buffer 116, in other words, the period during which the character string is stored in the history buffer 116 depends on which address of the dictionary area the character string is stored. As the character string of the address closer to the start address of the dictionary area is discarded from the history buffer 116 at an earlier timing, the period during which the character string is stored in the history buffer 116 is shorter. As the character string of the address closer to the last address of the dictionary area is discarded later from the history buffer 116, the period during which the character string is stored in the history buffer 116 is longer.

The host 10 according to the first embodiment determines the writing address of the dictionary area of the character string depending on the score of the character string, and writes the character string to the dictionary area. That is, the host 10 writes the character string to the dictionary area depending on the score of the character string. The character string having a high score has a high appearance frequency in the teacher data, and the appearance position is later. When the history buffer 116 stores character strings having higher scores, compression ratio is improved. Therefore, the host 10 associates the last one character of the character string having the highest score with the last address of the dictionary area, and writes the character string to the dictionary area such that the character strings are stored in descending order of scores from the last address of the dictionary area toward the start address of the dictionary area (S112). When the host 10 writes the character string to the start address of the dictionary area, the generation of the preset dictionary is completed.

Figure 9:
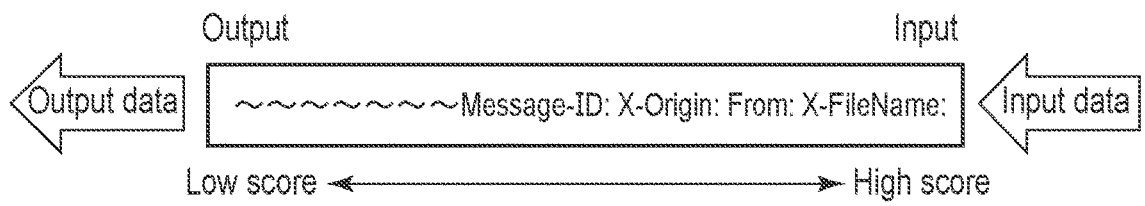
FIG. 9 illustrates an example of a preset dictionary according to the first embodiment.

The host 10 transmits the preset dictionary to the storage system 12 (S114). The storage system 12 writes the preset dictionary to the history buffer 116. FIG. 9 illustrates an example of a preset dictionary stored in the history buffer 116 according to the first embodiment. Since the character string is read from the dictionary area in ascending order of the score, the character string is written to the history buffer 116 in ascending order of the score. Therefore, a character string having the lowest score is stored at the output side of the history buffer 116, and a character string "X-Filename:" having the highest score is stored at the input side of the history buffer 116.

Since the score is also proportional to the appearance position, a character string having the appearance position later in the teacher data is more likely to be stored at a position close to the start position of the preset dictionary, and is less likely to be discarded from the history buffer 116 immediately. For example, the character string "X-Filename:" has an appearance frequency of 20, and the appearance frequency is not so high. However, since the character string "X-Filename:" tends to appear at a relatively later position (appearance position: 159) in the teacher data, the score becomes high, and the character string "X-Filename:" is stored at a position close to the start position of the preset dictionary.

In a case where the score is calculated based on only the appearance frequency (in the case of (3=0 in Equations 1 and 2), the character string "X-Filename:" has an appearance frequency of 20, is stored at an intermediate position of the preset dictionary, and is discarded from the history buffer 116 after a while.

According to the first embodiment, a character string having a higher appearance frequency or a character string having a later appearance position in the character strings of the teacher data has a higher score. A character string having a higher score is stored in the vicinity of the input side of the history buffer 116. Therefore, a period during which a character string having a higher appearance frequency or a character string having a later appearance position is stored in the history buffer 116 is long. Therefore, a preset dictionary with improved compression ratio is generated.

Second Embodiment

A device configuration of a second embodiment is the same as that of the first embodiment.

Figure 10:
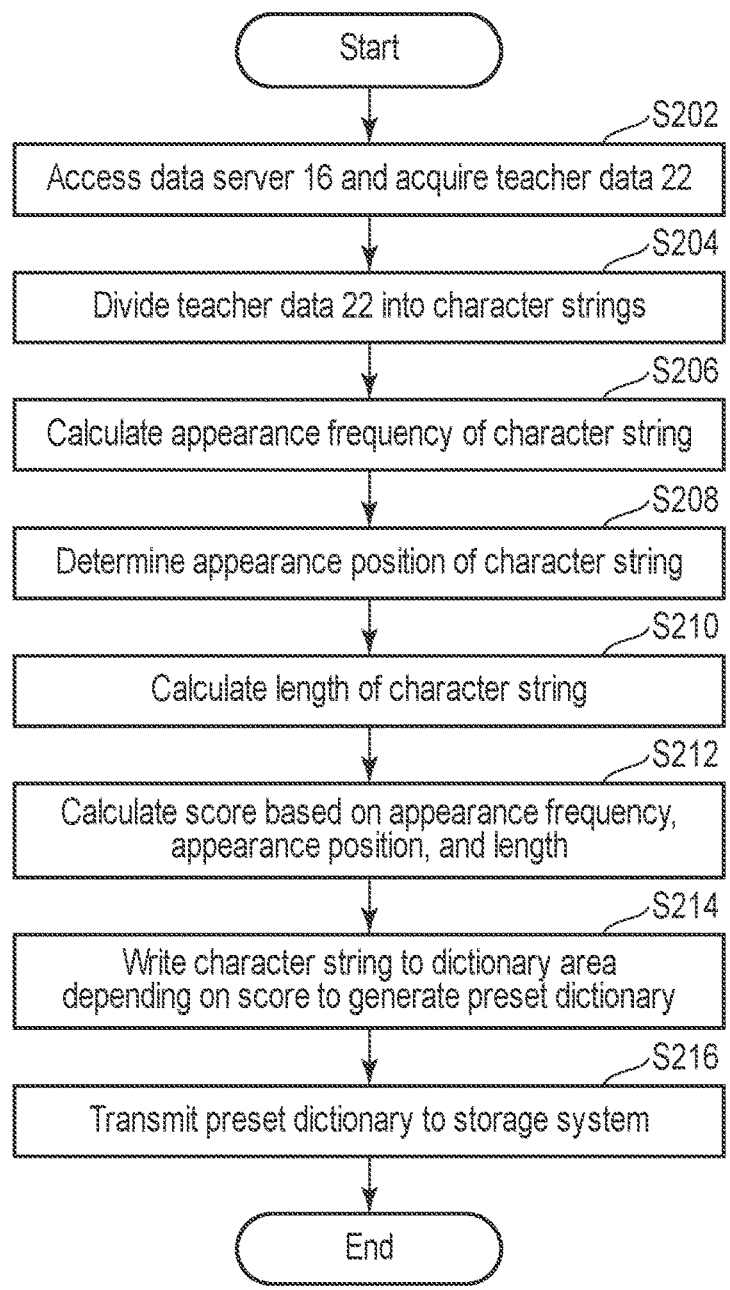
FIG. 10 is a flowchart illustrating an example of processing of a host according to the second embodiment.

FIG. 10 is a flowchart illustrating an example of processing according to the second embodiment in which the host 10 generates a preset dictionary. In a case where the storage system 12 is connected to the host 10 for the first time, the host 10 performs preset dictionary generation processing of FIG. 10 until the compressed data is written to the storage system 12.

The host 10 accesses the data server 16 and acquires the teacher data 22 (S202). An example of the teacher data 22 of the second embodiment is the same as the teacher data 22 of the first embodiment. The host 10 divides each of the plurality of teacher data 22 into a plurality of character strings (S204). The division example of the teacher data of the second embodiment is the same as the division example of the first embodiment.

The host 10 calculates appearance frequency of each character string in the plurality of teacher data 22 (S206). The host 10 determines an appearance position of each character string (S208). The host 10 calculates the length of each character string (S210). The length is a byte length of a character string. For example, the byte length of "Message-ID:" is 11, and the byte length of "<0123456." is 9.

The host 10 calculates a score of each character string based on the appearance frequency, the appearance position, and the length of each character string (S212). The score is calculated, for example, by the following equation so as to be proportional to the appearance frequency, the appearance position, and the length.

$$\text{Score} = \alpha \times AF + \beta \times AP + \gamma \times L \quad \text{Equation 3 or}$$

$$\text{Score} = \alpha \times AF \times \beta \times AP \times \gamma \times L \quad \text{Equation 4}$$

$\alpha$, $\beta$, and $\gamma$ are different constants which are arbitrarily determined. The constant may be a decimal or an integer.

L: length

Figures 11, 12:
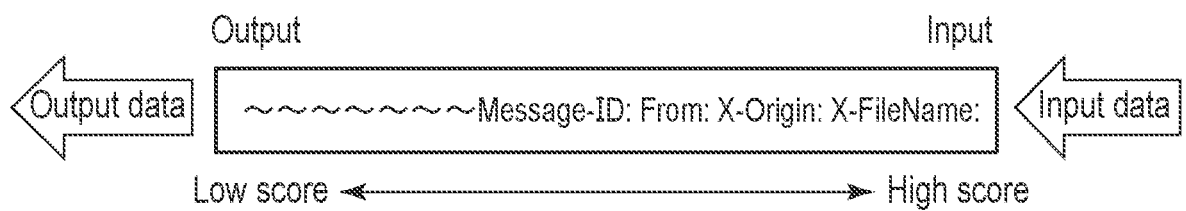
FIG. 11 is a table illustrating an example of a score according to the second embodiment.
FIG. 12 illustrates an example of a preset dictionary according to the second embodiment.

FIG. 11 is a table illustrating an example of the score based on the appearance frequency, the appearance position, and the length of each character string, according to the second embodiment. The score is calculated by Equation 4 with $\alpha=1$, $\beta=1$, and $\gamma=1$. The table of FIG. 11 is stored in the RAM 36.

The host 10 writes the character strings to the dictionary area such that the last one character of the character string having the highest score is stored at the last address of the dictionary area (S214). The character strings are stored in the dictionary area in descending order of scores from the last address of the dictionary area toward the start address. When the host 10 writes the character strings to the start address of the dictionary area, the generation of the preset dictionary is completed.

The host 10 transmits the preset dictionary to the storage system 12 (S216). The storage system 12 writes the preset dictionary to the history buffer 116. FIG. 12 illustrates an example of the preset dictionary stored in the history buffer 116 according to the second embodiment. The character string having the lowest score is stored at the output side of the history buffer 116, and the character string "X-Filename:" having the highest score is stored at the input side.

Since the score is also proportional to the length, the long character string is more likely to be stored at a position close to the input side of the history buffer 116, and is less likely to be immediately discarded from the history buffer 116. For example, in the first embodiment, the score of the character string "From:" is 2430, the score of the character string "X-Orign:" is 2070, and the character string "From:" is stored at a position closer to the start position of the preset dictionary than the character string "X-Orign:". However, in the second embodiment, since the score is calculated also in consideration of the length, the score of the short character string "From:" is 12150, the score of the long character string "X-Orign:" is 18630, and the character string "X-Orign" is stored at a position closer to the start position of the preset dictionary than the character string "From:".

According to the second embodiment, a character string having a higher appearance frequency, a character string having an appearance position at a later position, or a character string having a longer byte length in the character strings of the teacher data has a higher score, and a character string having a higher score is stored at a position close to the input side of the history buffer 116. Therefore, a character string having a higher appearance frequency, a character string having an appearance position at a later position, or a character string having a longer byte length is stored in the history buffer 116 for a longer period, so that a preset dictionary with improved compression ratio is generated.

Third Embodiment

A device configuration of a third embodiment is the same as that of the first embodiment.

Figure 13:
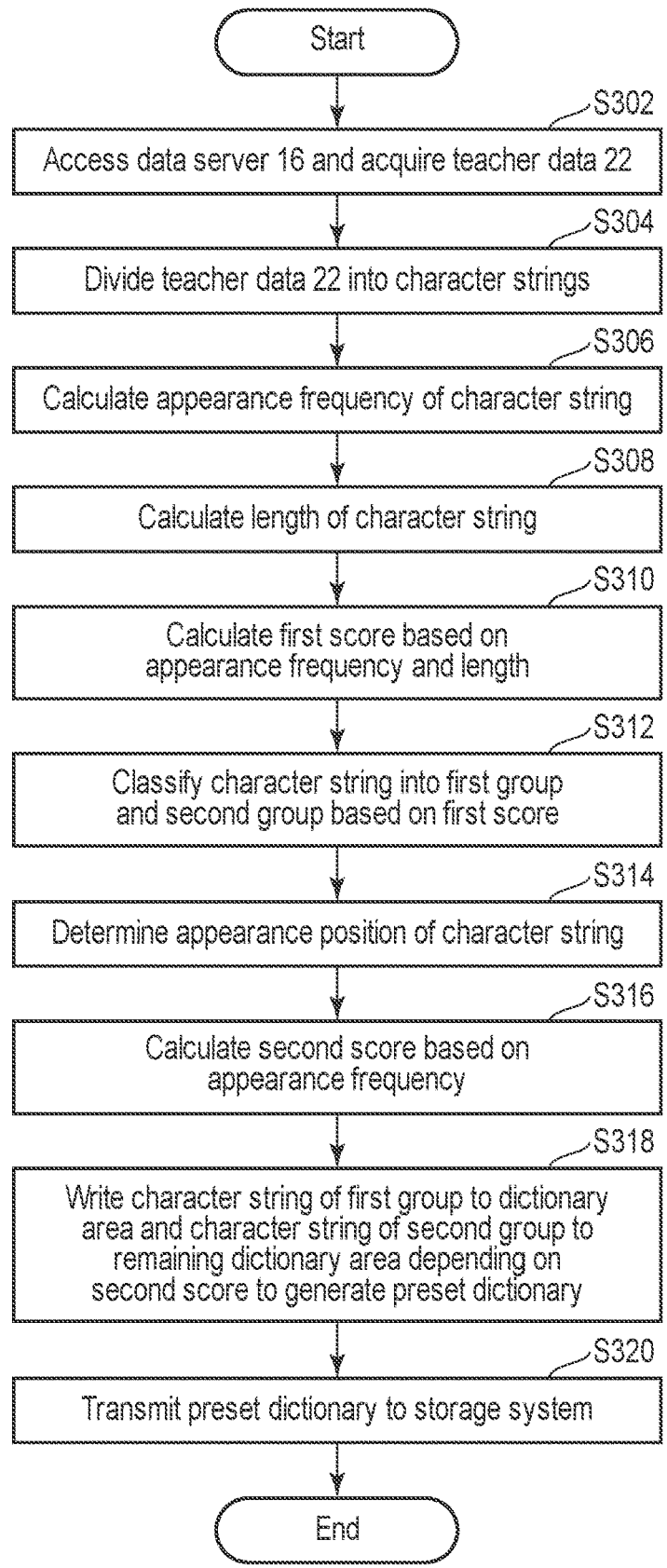
FIG. 13 is a flowchart illustrating an example of processing of a host according to a third embodiment.

FIG. 13 is a flowchart illustrating an example of processing according to the third embodiment in which the host 10 generates a preset dictionary. In a case where the storage system 12 is connected to the host 10 for the first time, the host 10 performs preset dictionary generation processing of FIG. 13 until the compressed data is written to the storage system 12.

The host 10 accesses the data server 16 and acquires the teacher data 22 (S302). An example of the teacher data 22 of the third embodiment is the same as the teacher data 22 of the first embodiment. The host 10 divides each of the plurality of teacher data 22 into a plurality of character strings (S304). The division example of the teacher data of the third embodiment is the same as the division example of the first embodiment.

The host 10 calculates appearance frequency of each character string in the plurality of teacher data 22 (S306). The host 10 calculates the length of each character string (S308).

The host 10 calculates the first score of each character string based on the appearance frequency and the length of each character string (S310). The first score is calculated, for example, by the following equation so as to be proportional to the appearance frequency and the length.

$$\text{First score} = \alpha \times AF + \gamma \times L \quad \text{Equation 5 or}$$

$$\text{First score} = \alpha \times AF \times \gamma \times L \quad \text{Equation 6}$$

$\alpha$ and $\gamma$ are different constants which are arbitrarily determined. The constant may be a decimal or an integer.

FIG. 14 is a table illustrating an example of the first score based on the appearance frequency and the length of each character string, according to the third embodiment. The first score is calculated by Equation 5 with $\alpha=1/2$ and $\gamma=1/2$. The table of FIG. 14 is stored in the RAM 36.

The host 10 classifies the character string into a first group and a second group based on the first score (S312). The first group is a character string having the first score equal to or greater than a threshold. The second group is a character string having the first score less than the threshold.

The host 10 calculates an appearance position of each character string (S314). The host 10 calculates the second score of each character string based on the appearance position of each character string (S316). The second score is calculated, for example, by the following equation so as to be proportional to the appearance frequency.

$$\text{Second score} = \beta \times AF \qquad \text{Equation 7}$$

β is an arbitrarily determined different constant. The constant may be a decimal or an integer.

FIG. 15A is a table illustrating an example of the second score based on the appearance position of each string of the first group, according to the third embodiment. The character strings are sorted in ascending order of the appearance position. FIG. 16A is a table illustrating an example of the second score based on the appearance position of a character string of the second group, according to the third embodiment. The character strings are sorted in ascending order of the appearance position. The second score is calculated by Equation 7 with β=1/2. Note that the calculation result of the decimal point is truncated. However, the decimal point may have a value after the decimal point without discarding the calculation result of the decimal point.

The host 10 sorts the character strings of the first group and the character strings of the second group in descending order of the second score. FIG. 15B is a table illustrating an example of a result of sorting the character strings of the first group in descending order of the second score, according to the third embodiment. FIG. 16B is a table illustrating an example of a result of sorting the character strings of the second group in descending order of the second score, according to the third embodiment.

With respect to the first group, the host 10 writes the character strings to the dictionary area such that the last one character of the character string having the highest second score is stored at the last address of the dictionary area. The character strings are stored from the last address of the dictionary area toward the start address in descending order of the second score. In a case where the dictionary area includes an area (remaining dictionary area) which is able to store the character string, the host 10 writes the character string of the second group to the remaining dictionary area such that the last one character of the character string having the highest second score is stored at the last address of the remaining dictionary area. The character strings are stored from the last address of the remaining dictionary area toward the start address in descending order of the second score (S318). When the host 10 writes the character strings to the start address of the dictionary area, the generation of the preset dictionary is completed.

In the dictionary area, an area allocated to store the character string of the first group is referred to as a first area. The first area may be the entire dictionary area or a partial area of the dictionary area. In a case where the first area is the entire dictionary area, all character strings of the first group may be stored in the first area, or there may be a character string that is not stored in the first area. In a case where the first area is a partial area of the dictionary area, all character strings of the first group are stored in the first area. In a case where the first area is a part of the dictionary area, the remaining dictionary area is the second area allocated for storage of the character string of the second group. All character strings of the second group may be stored in the second area, or some of the character strings of the second group may not be stored in the second area.

Figure 17:
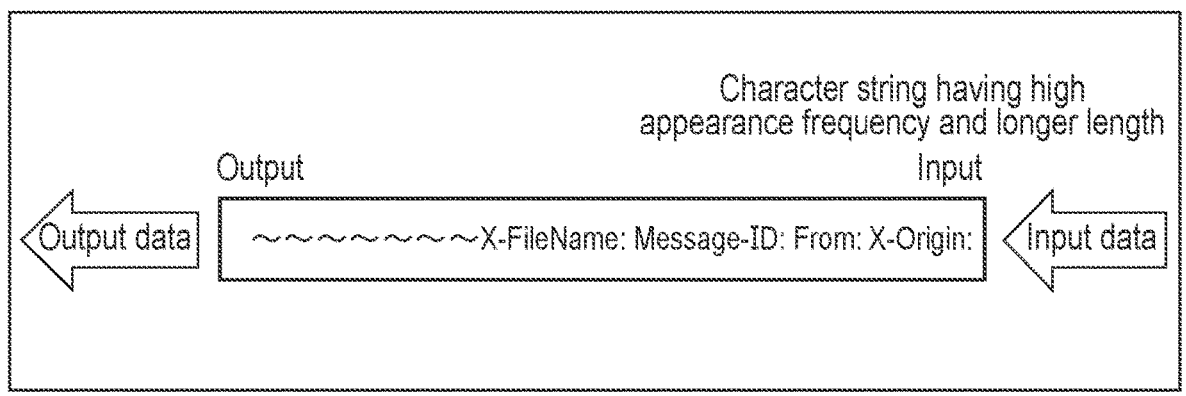
FIG. 17 illustrates an example of a preset dictionary according to the third embodiment.

The host 10 transmits the preset dictionary to the storage system 12 (S320). The storage system 12 writes the preset dictionary to the history buffer 116. FIG. 17 illustrates an example of the preset dictionary stored in the history buffer 116, according to the third embodiment. In the input side of the history buffer 116, the character strings of the first group are stored in descending order of the second score. In the output side, the character strings of the second group are stored in descending order of the second score. Since the character string of the first group has a higher first score, a character string having a higher appearance frequency and a longer length to be left in the history buffer 116 for a long time is stored closer to the input side.

According to the third embodiment, the character strings of the first group are stored in the history buffer 116 in descending order of the second score from the input side, and the character strings of the second group are stored in the remaining dictionary area in descending order of the second score. As a result, a character string having a higher appearance frequency or a longer length is likely to remain in the history buffer 116 for a long time, so that compression ratio is improved.

The first score of the criterion for classifying the character strings into two groups is not limited to the score described above. The character strings may be classified based on the first score which is related to any one or two of the appearance frequency, the appearance position, and the character string length. The arrangement of the character strings within each group may be based on a second score which is related to the remaining two or one of the appearance frequency, the appearance position, and the character string length. In addition, the number of classifications is not limited to two, and may be three or more.

Fourth Embodiment

A device configuration of a fourth embodiment is the same as that of the first embodiment.

Figure 18:
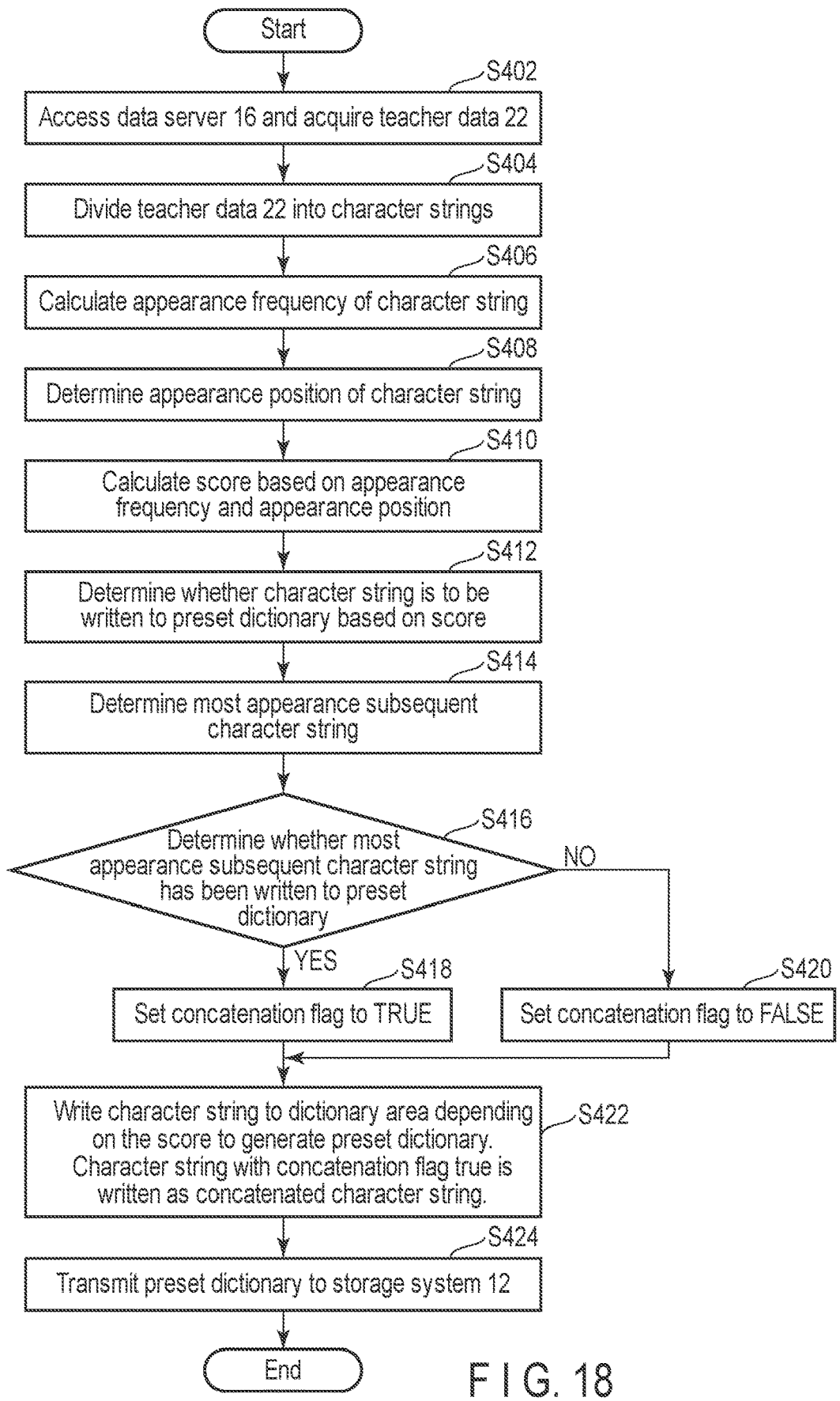
FIG. 18 is a flowchart illustrating an example of processing of a host according to the fourth embodiment.

FIG. 18 is a flowchart illustrating an example of processing according to the fourth embodiment in which the host 10 generates a preset dictionary.

The host 10 accesses the data server 16 and acquires the teacher data 22 (S402). An example of the teacher data 22 of the fourth embodiment is the same as the teacher data 22 of the first embodiment. The host 10 divides each of the plurality of teacher data 22 into a plurality of character strings (S404). The division example of the teacher data of the fourth embodiment is the same as the division example of the first embodiment.

The host 10 calculates appearance frequency of each character string in the plurality of teacher data 22 (S406). The host 10 calculates an appearance position of each character string (S408).

The host 10 calculates a score of each character string based on the appearance frequency and the appearance position of each character string (S410). The score is calculated in the same manner as in the second embodiment.

The host 10 determines whether or not the character string is to be written to the preset dictionary based on the score (S412). The host 10 determines that a character string having a score equal to or greater than a threshold is to be written to the preset dictionary.

The host 10 determines a subsequent character string having the highest appearance frequency of each character string (a most appearance subsequent character string) in the preset dictionary (S414). The host 10 determines whether or not the most appearance subsequent character string has been written to the preset dictionary (S416).

In a case where the most appearance subsequent character string has been written to the preset dictionary (YES in S416), the host 10 sets the concatenation flag to TRUE (S418). In a case where the most appearance subsequent character string has not been written to the preset dictionary (NO in S416), the host 10 sets the concatenation flag to FALSE (S420). The concatenation flag is TRUE when two conditions are satisfied. The first condition indicates that the character string has been written to the preset dictionary. The second condition indicates that a most appearance subsequent character string has been written to the preset dictionary.

The host 10 writes the character string to the dictionary area at a position depending on the score, and generates a preset dictionary (S422). The character string in which the concatenation flag is TRUE is written as a character string concatenated to the subsequent character string. A character string once written to the preset dictionary as a subsequent character string is not written again to another position of the preset dictionary. The host 10 transmits the preset dictionary to the storage system 12 (S424). The storage system 12 writes the preset dictionary to the history buffer 116.

FIG. 19 illustrates an example of the appearance frequency, the appearance position, the score, a preset dictionary writable flag, a most appearance subsequent character string, a preset dictionary writable flag of the most appearance subsequent character string, the concatenation flag, and a concatenated character string in the preset dictionary, according to the fourth embodiment. In the example of FIG. 19, the character string "Message-ID:" is often followed by the character string "<0123456.", and since the character string "<0123456." has been written to the preset dictionary, the concatenation flag of the character string "Message-ID:" is TRUE. Therefore, the character string "Message-ID:" is concatenated to the most appearance subsequent character string "<0123456.", and is written to the preset dictionary as the concatenated character string "Message-ID: <0123456.". In a case where the character string "Message-ID:" and the character string "<0123456." are not concatenated in the preset dictionary, the dictionary matching is determined separately from each other, and two sets of outputs of the dictionary-based compression (matching relative distance, matching length) are output. On the other hand, when the dictionary matching is determined in the concatenated character string "Message-ID: <0123456.", only one set of outputs of the dictionary-based compression (matching relative distance, matching length) is output, and thus the compressed data is shortened.

Figure 20:
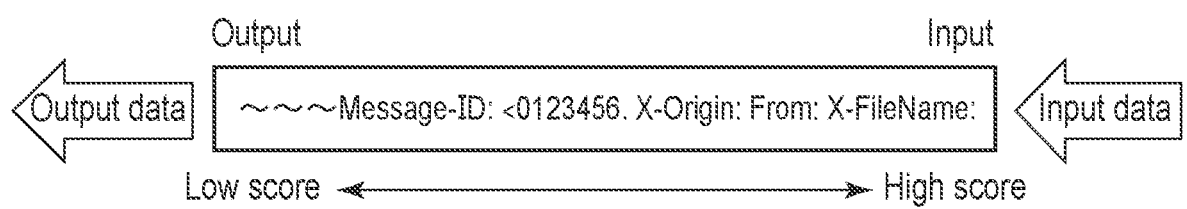
FIG. 20 illustrates an example of a preset dictionary according to the fourth embodiment.

FIG. 20 illustrates an example of a preset dictionary stored in the history buffer 116, according to the fourth embodiment. A character strings are stored in the history buffer 116 from the input side in a descending order of the score. If concatenation flag is TRUE, the character string is concatenated with the subsequent character string. According to the fourth embodiment, since the dictionary matching information can be concatenated to one information, compression ratio is improved.

The score for determining whether the character string is to be written to the preset dictionary is not limited to the score calculated from the appearance frequency and the appearance position. A score calculated from one, two, or all of appearance frequency, appearance position, and length may be used for determining whether the character string is to be written to the preset dictionary.

While certain embodiments have been described, these embodiments have been presented by way of example only, and are not intended to limit the scope of the inventions. Indeed, the novel devices and methods described herein may be embodied in a variety of other forms; furthermore, various omissions, substitutions, and changes in the form according to the embodiments described herein may be made without departing from the spirit of the inventions. The accompanying claims and their equivalents are intended to cover such forms or modification as would fall within the scope and spirit of the inventions.

What is claimed is:

1. An information processing apparatus comprising a processor configured to generate a preset dictionary based on teacher data, wherein
the processor is configured to:
divide the teacher data into character strings;
calculate a score of each of the character strings based on at least an appearance position of each of the character strings in the teacher data among an appearance frequency of each of the character strings, the appearance position of each of the character strings, and a length of each of the character strings; and
determine a position of each of the character strings in the preset dictionary based on the score.

2. The information processing apparatus of claim 1, wherein the processor is configured to calculate the score of each of the character strings based on the appearance frequency and the appearance position.

3. The information processing apparatus of claim 1, wherein the processor is configured to calculate the score of each of the character strings based on the appearance frequency, the appearance position, and the length.

4. The information processing apparatus of claim 1, wherein the processor is configured to determine a position of each of the character strings in the preset dictionary such that a character string having a lower score is discarded from the preset dictionary earlier than a character string having a higher score.

5. The information processing apparatus of claim 1, wherein the processor is configured to determine a position of each of the character strings in the preset dictionary such that a period during which a character string having a higher score is stored in the preset dictionary is longer than a period during which a character string having a lower score is stored in the preset dictionary.

6. The information processing apparatus of claim 1, wherein the processor is configured to transmit the preset dictionary to a dictionary-based compression apparatus.

7. The information processing apparatus of claim 6, wherein the dictionary-based compression apparatus is included in a storage system.

8. The information processing apparatus of claim 1, wherein
the preset dictionary is stored in a memory in which data written first is discarded first, and
the processor is configured to determine a position of each of the character strings in the preset dictionary such that a character string having a higher score is positioned closer to an input side of the memory than a character string having a lower score.

9. The information processing apparatus of claim 1, wherein
the processor is configured to:
obtain a subsequent character string subsequent to the character string; and
determine whether the character string and the subsequent character string can be concatenated and whether the concatenated character string can be written to the preset dictionary based on the score of the character string and the score of the subsequent character string.

10. The information processing apparatus of claim 9, wherein the processor is configured to:
> determine whether the character string can be written to the preset dictionary based on the score of the character string;
> determine whether the subsequent character string can be written to the preset dictionary based on the score of the subsequent character string; and in a case where it is determined that the character string can be written to the preset dictionary and it is determined that the subsequent character string can be written to the preset dictionary, determine that the character string and the subsequent character string can be concatenated and the concatenated character string can be written to the preset dictionary.

11. An information processing apparatus comprising a processor configured to generate a preset dictionary based on teacher data, wherein
the processor is configured to:
> divide the teacher data into a plurality of character strings;
> calculate a first score of each of the character strings based on any one or two of an appearance frequency of each of the character strings, an appearance position of each of the character strings, and a length of each of the character strings;
> classify a character string having the first score equal to or greater than a threshold into a first group;
> classify a character string having the first score less than the threshold into a second group;
> calculate a second score of each of the character strings based on another two or one of the appearance frequency of each of the character strings, the appearance position of each of the character strings, and a length of each of the character strings;
> determine a position of the character string of the first group in a first area allocated to the first group in the preset dictionary based on the second score; and
> determine a position of the character string of second group in an area other than the first area in the preset dictionary based on the second score.

12. The information processing apparatus of claim 11, wherein
the processor is configured to:
> calculate the first score of each of the character strings based on the appearance frequency and the length, and
> calculate the second score of each of the character strings based on the appearance position.

13. He information processing apparatus of claim 11, wherein the processor is configured to determine a position of each of the character strings in the preset dictionary such that the character string having a low second score is discarded from the preset dictionary earlier than the character string having a high second score.

14. The information processing apparatus of claim 11, wherein the processor is configured to determine a position of each of the character strings in the preset dictionary such that a period during which a character string having a high second score is stored in the preset dictionary is longer than a period during which a character string having a low second score is stored in the preset dictionary.

15. The information processing apparatus of claim 11, wherein the processor is configured to transmit the preset dictionary to a dictionary-based compression apparatus included in a storage system.

16. The information processing apparatus of claim 11, wherein
the preset dictionary is stored in a memory in which data written first is discarded first, and
the processor is configured to determine a position of each of the character strings in the preset dictionary such that a character string having a high second score is positioned closer to an input end side of the memory than a character string having a low second score.

17. A method of generating a preset dictionary based on teacher data, comprising:
dividing the teacher data into character strings;
calculating a score of each of the character strings based on at least an appearance position of each of the character strings in the teacher data among an appearance frequency of each of the character strings, the appearance position of each of the character strings, and a length of each of the character strings; and
determining a position of each of the character strings in the preset dictionary based on the score.

18. A method of generating a preset dictionary based on teacher data, comprising:
dividing the teacher data into a plurality of character strings;
calculating a first score of each of the character strings based on any one or two of an appearance frequency of each of the character strings, an appearance position of each of the character strings, and a length of each of the character strings;
classifying a character string having the first score equal to or greater than a threshold into a first group;
classifying a character string having the first score less than the threshold into a second group;
calculating a second score of each of the character strings based on another two or one of the appearance frequency of each of the character strings, the appearance position of each of the character strings, and a length of each of the character strings;
determining a position of the character string of the first group in a first area allocated to the first group in the preset dictionary based on the second score; and
determining a position of the character string of second group in an area other than the first area in the preset dictionary based on the second score.

19. The information processing apparatus of claim 1, wherein each of the character strings comprises characters.

20. The information processing apparatus of claim 19, wherein the appearance position of each of the character strings is a position of a first character of each of the character strings.

* * * * *